United States Patent
Meade et al.

(10) Patent No.: US 9,310,552 B2
(45) Date of Patent: Apr. 12, 2016

(54) METHODS AND APPARATUS PROVIDING THERMAL ISOLATION OF PHOTONIC DEVICES

(75) Inventors: Roy Meade, Boise, ID (US); Gurtej Sandhu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 157 days.

(21) Appl. No.: 13/524,446

(22) Filed: Jun. 15, 2012

(65) Prior Publication Data

US 2013/0336613 A1 Dec. 19, 2013

(51) Int. Cl.
*H01L 27/14* (2006.01)
*G02B 6/12* (2006.01)
*G02F 1/01* (2006.01)
*G02F 1/313* (2006.01)

(52) U.S. Cl.
CPC .............. *G02B 6/12* (2013.01); *G02B 6/12007* (2013.01); *G02F 1/0147* (2013.01); *G02F 1/3132* (2013.01); *G02F 1/3133* (2013.01); *G02F 2203/15* (2013.01)

(58) Field of Classification Search
CPC ............... H01L 2933/0083; H01L 2223/6627; H01L 21/02098; G02F 1/025; G02F 1/035; G02F 1/225; G02F 1/2257; G02F 1/2255; G02F 1/313
See application file for complete search history.

(56) References Cited

U.S. PATENT DOCUMENTS

| | | | |
|---|---|---|---|
| 7,034,641 B1 | 4/2006 | Clarke et al. | |
| 7,920,770 B2 | 4/2011 | Holzwarth et al. | |
| 7,941,014 B1 * | 5/2011 | Watts et al. | 385/32 |
| 7,947,609 B2 | 5/2011 | Feurprier | |
| 2005/0269666 A1 * | 12/2005 | Chung et al. | 257/528 |
| 2010/0119231 A1 | 5/2010 | Kim et al. | |
| 2011/0309513 A1 | 12/2011 | Biegelsen et al. | |
| 2012/0138568 A1 * | 6/2012 | Na | 216/24 |

FOREIGN PATENT DOCUMENTS

| | | |
|---|---|---|
| CN | 102051022 A | 5/2011 |
| DE | 44 46 101 A1 | 7/1996 |
| DE | 4446101 A1 | 7/1996 |
| EP | 1 967 876 A1 | 9/2008 |
| JP | 2000056278 A | 2/2000 |
| JP | 2000206476 A | 7/2000 |
| JP | 2002194164 A | 7/2002 |
| JP | 2010512016 A | 4/2010 |
| WO | 0244777 A1 | 6/2002 |
| WO | 2009051267 A1 | 4/2009 |

OTHER PUBLICATIONS

"Thermal Conductivity Measurements of Thin-Film Silicon Dioxide," Proc IEEE 1989 Int. Conference on Microelectronic Test Structures, vol. 2, No. 1, Mar. 1989, pp. 121-125.

"Limits to Silicon Modulator Bandwith and Power Consumption," Michael R. Watts, et al., Proc. of SPIE vol. 7221, 72210M 2009, pp. 1-8.

Office Action mailed Dec. 1, 2015 in Japan Application No. 2015-517394, 9 pages.

* cited by examiner

*Primary Examiner* — David Vu
*Assistant Examiner* — Cuong Nguyen
(74) *Attorney, Agent, or Firm* — Perkins Coie LLP

(57) ABSTRACT

Described embodiments include photonic integrated circuits and systems with photonic devices, including thermal isolation regions for the photonic devices. Methods of fabricating such circuits and systems are also described.

24 Claims, 20 Drawing Sheets

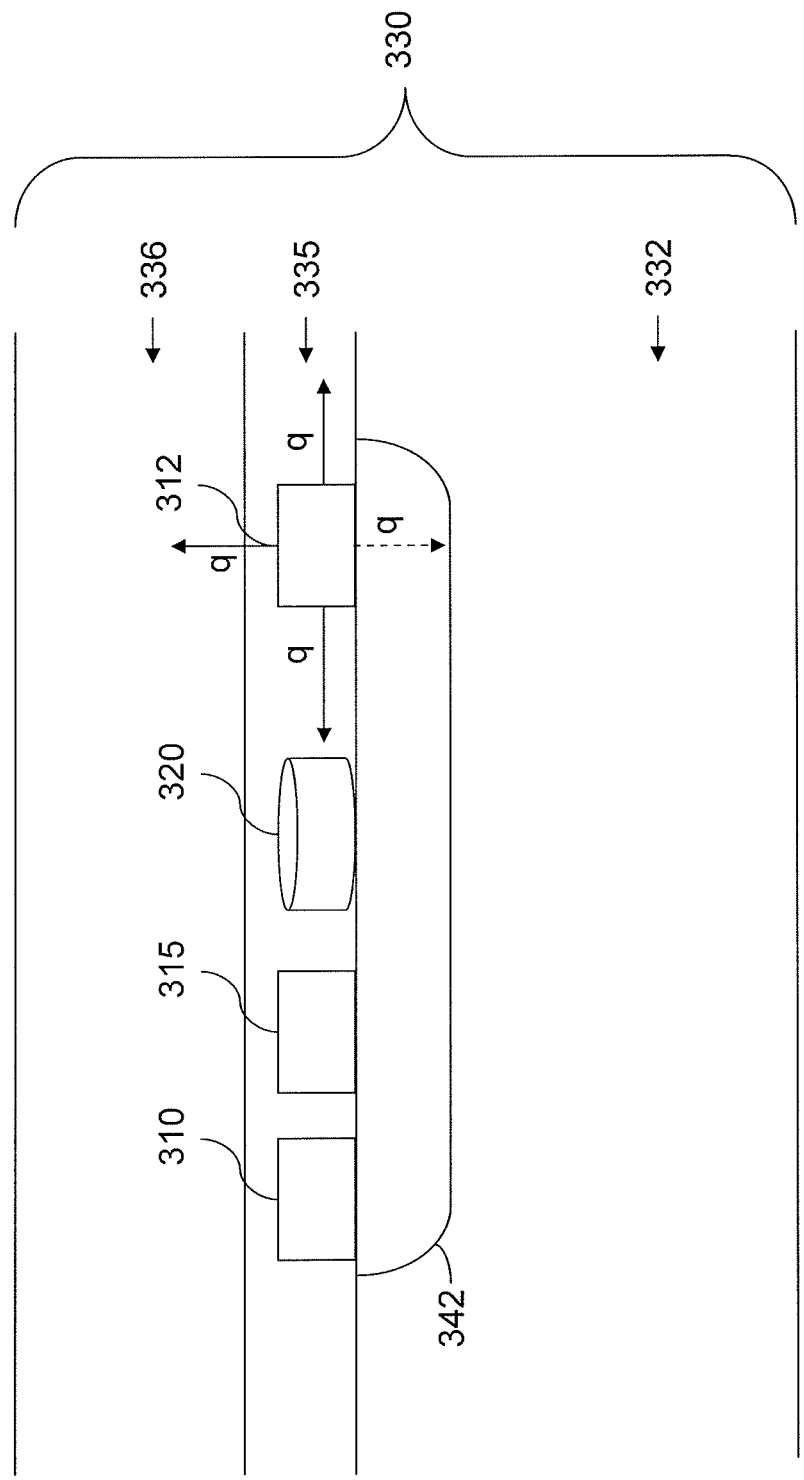

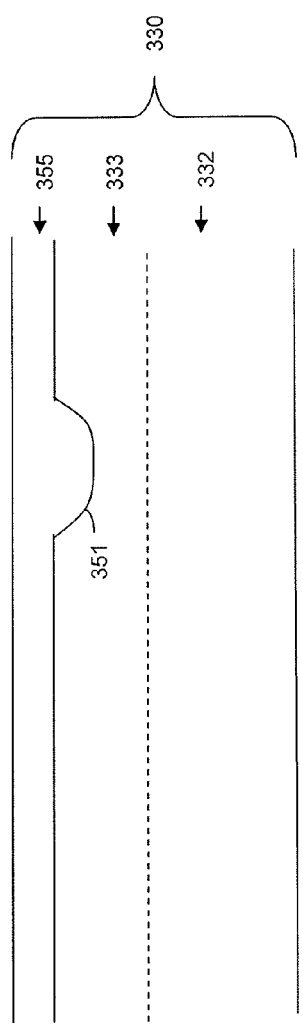
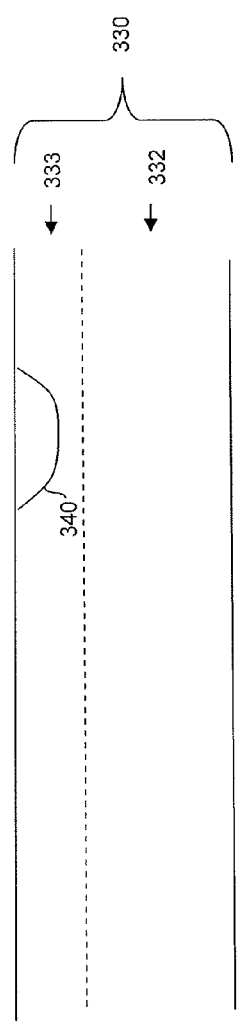
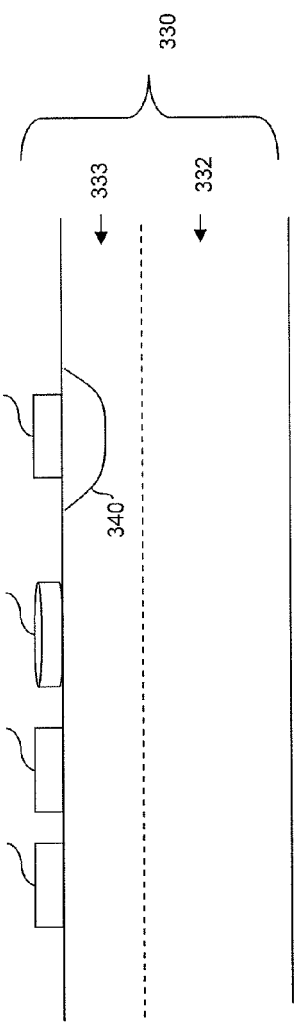
FIG. 4D
FIG. 4E
FIG. 4F

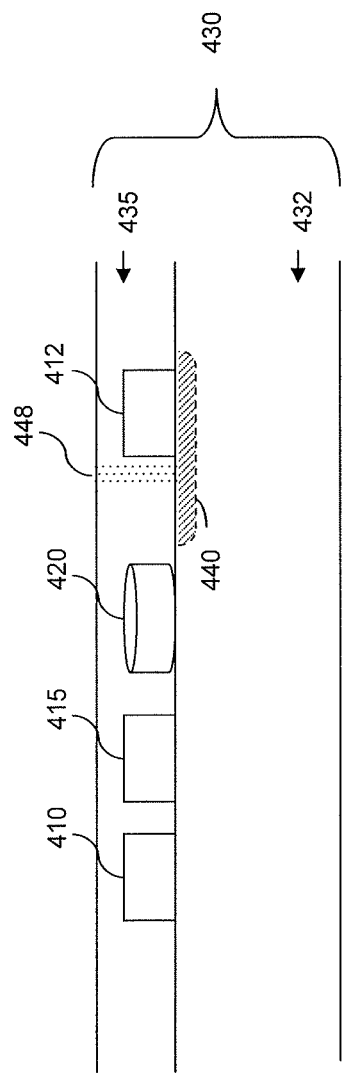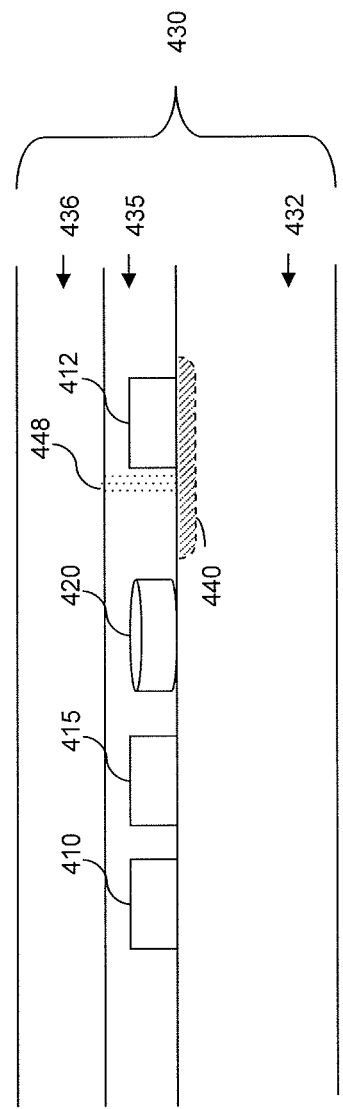

METHODS AND APPARATUS PROVIDING THERMAL ISOLATION OF PHOTONIC DEVICES

TECHNICAL FIELD

Described embodiments relate generally to the field of electronic-photonic devices, and more particularly to the thermal isolation of electronic-photonic devices.

BACKGROUND

Optical transmission may be used as a means for communication between separate integrated circuit die (also referred to as inter-die connections), and between components on the same die (also referred to as intra-die connections). Photonic devices are a class of devices that are capable of sourcing, controlling, and/or detecting optical transmission of signals.

The term "silicon photonics" relates to the study and application of photonic systems-that use silicon as an optical medium. Instead of, or in addition to, using silicon to facilitate the flow of electricity, silicon can be used to direct the flow of photons or light. Silicon is transparent to infrared light with wavelengths above about 1.1 micrometers. Silicon also has a high refractive index of about 3.5. The tight optical confinement provided by this high index allows for microscopic optical waveguides, which may have cross-sectional dimensions of only a few hundred nanometers, thus facilitating integration with current nano-scale semiconductor technologies that also employ silicon, such as complementary metal oxide semiconductor (CMOS) technologies. Silicon photonic devices can thus be made using existing semiconductor fabrication techniques. Further, because silicon is already used as a substrate for many electronic integrated circuits, it is possible to create hybrid devices employing both optical and electronic components integrated onto a single die.

In response to more demanding communication bandwidth, energy consumption, and performance standards for electronic devices such as semiconductor devices, photonic devices are increasingly being integrated with optical/electrical circuits to form a type of electronic-photonic device called an electronic-photonic integrated circuit. For example, in the semiconductor industry, photonic devices have various applications including communication within a die, between multiple die of a computer board, and between computer boards.

In inter-die communications via optical interconnects, each die on the circuit board can be interfaced with a photonic-electronic transmitter-receiver circuit, with two die operably connected via an optical waveguide. Likewise, in intra-die communications, optical waveguides may be used to connect components within a die, such as between an integrated optical source and a photonic detector.

FIG. 1 illustrates a block diagram of one example of a conventional photonic multiplexing system 100. The system 100 includes multiple carrier wave input devices 110a, 110b, 110c, 110d (generally referred to as an input device 110), each of which may be, for example, an optical source configured to generate an optical carrier wave at a respective transmission wavelength. For example, each input device 110 may include a coherent light source, such as a laser (e.g., a hybrid silicon laser or a gallium arsenide laser), or other appropriate light source known in the art.

The optical carrier wave from each input device 110a-d is transmitted to a respective resonant carrier wave modulator 120a-d along a respective optical waveguide 115a-d. Carrier wave modulators 120a-d are configured to receive respective optical carrier waves having different wavelengths from the respective input devices 110a-d, and to modulate data on the optical carrier wave that it receives. For example, carrier wave modulators 120a-d may be optical modulators configured to receive an optical data signal and output a modulated optical data signal, or electro-optical modulators configured to receive an electrical data signal from an electrically conductive interconnect and output a modulated optical data signal. The modulated light from each of the carrier wave modulators 120a-d is then combined and transmitted onto a single transmission channel (e.g., optical waveguide 140) using an optical multiplexer 130. The multiplexed light is transmitted along optical waveguide 140 to an endpoint (not shown) that may include, e.g., one or more photonic detectors for detecting optical transmissions, where the light is de-multiplexed and demodulated before being used by an endpoint device.

Wave guiding of an optical carrier wave through optical waveguides 115, 140 occurs through internal reflection of electromagnetic waves of an optical carrier wave at the interface between a higher refractive index inner core and a lower refractive index outer cladding. For example, the inner core of an optical waveguide 115 may be formed of a silicon (Si) or silicon-containing material, and may have a refractive index of approximately 3.5. The cladding of an optical waveguide 115 may be formed of a material having a lower index of refraction, for example, a $SiO_2$ material with a refractive index of approximately 1.5.

Several components within a photonic system, and particularly components operating at a resonance frequency, can be affected by variations in temperature. Variations in temperature can result in changes in the device dimensions (due to thermal expansion) and refractive indices of materials. As one example, an optical laser providing one or more carrier wavelengths can be tuned by changing its temperature. As another example, changes in temperature can affect the operation of a resonant carrier wave modulator 120. The resonant frequency of a particular modulator 120 is controlled in part by the refractive indices of its resonant structures, which may change according to temperature, resulting in turn in a deviation of the resonant frequency of the modulator 120. Accordingly, certain photonic devices require a stable thermal environment to perform optimally.

One technique for providing a stable thermal environment for photonic devices includes active temperature control of one or more photonic devices, such as through an electric heating device. FIG. 2A shows a top-down view of photonic devices including an input device 110 (e.g., a laser), an optical waveguide 115, and a resonant carrier wave modulator 120, formed in a portion of a silicon die 230. A heating device 212 provides active temperature control of carrier wave modulator 120. Heating device 212 may be, for example, a resistive or inductive element, such as a polysilicon, silicon, or copper element, that is configured to receive energy (e.g., electrical energy) and output heat to the surrounding photonic devices. As shown in FIG. 2A, heating device 212 may be customized to modulator 120, by partially encircling modulator 120, or may have any other shape and be located near other temperature-sensitive photonic devices, as well as carrier wave modulator 120. In other embodiments, heating device 212 may be integrated with carrier wave modulator 120.

FIG. 2B shows a cross-sectional view of photonic devices formed in a portion of a silicon on insulator (SOI) integrated circuit die 230. Die 230 includes an input device 110 (e.g., a laser), an optical waveguide 115, and a resonant carrier wave modulator 120. Die 230 includes a substrate 232, which may be, for example, a bulk region of thermally conductive silicon. The SOI structure also includes an insulator region 233 (also referred to as a buried oxide or "BOX" region) composed of an insulating material, such as SiO$_2$, which acts as a bottom cladding layer for an optical waveguide 115. Die 230 may also include an interlevel dielectric (ILD) region 236 having a lower layer composed of, for example, SiO$_2$, formed above the device formation layer 235. The lower layer of ILD region 236 provides an upper cladding region for optical waveguide 115, and upper levels of the ILD region 236 are used for forming electrical connections in various locations of die 230, such as above the device formation region 235. Typically, photonic devices, including input device 110 (e.g., a laser), optical waveguide 115, and resonant carrier wave modulator 120, as well as heating device 212, are formed in the device formation region 235 above the substrate 232. Device formation region 235 may include regions of silicon for forming photonic devices, such as the inner core of optical waveguide 115 and modulator 120, and regions of a cladding material, such as SiO$_2$, on the sides of optical waveguide 115 to serve as cladding surrounding a silicon waveguide core, and to serve as an insulating and mechanically supportive material for the devices formed in device formation region 235. Other photonic devices, such as other optical waveguides, lasers, filters, or photonic detectors, may also be formed in the device formation region 235, and may be subjected to active temperature control using a heating device 212.

Referring to FIG. 2B, while heating device 212 provides active temperature control of one or more photonic devices, such as modulator 120, in device formation region 235, it emits heat q that dissipates in all directions, including into the substrate 232, which is formed of thermally conductive silicon, and into the ILD region 236. This results in wasted heat flux and a less efficient heating device 212. Additionally, photonic devices in die 230 are typically thermally coupled to the substrate 232, and any global temperature variation in the die 230 may have an effect on the photonic devices.

Accordingly, it is desirable to thermally isolate heating devices and photonic devices in a photonic system, in order to improve efficiency and to provide more stable operation of the photonic devices.

BRIEF DESCRIPTION OF THE DRAWINGS

FIGS. 3A-3E illustrate a top-down view and cross-sectional views, respectively, of die including thermal isolation regions, in accordance with embodiments described herein.

FIGS. 4A-4G illustrate processes for forming a die including a thermal isolation region, in accordance with embodiments described herein.

FIGS. 7A-7E illustrate processes for forming a die including a thermal isolation region, in accordance with embodiments described herein.

DETAILED DESCRIPTION

In the following detailed description, reference is made to various embodiments. These embodiments are described with sufficient detail to enable those skilled in the art to practice them. It is to be understood that other embodiments may be employed, and that various structural, logical and electrical changes may be made. In addition, where various processes are described, it should be understood that the steps of the processes may occur in an order other than how they are specifically described, unless noted otherwise.

Embodiments described herein include photonics devices and integrated circuits with a thermal isolation region for controlling dissipation of heat in a photonic system. For example, a thermal isolation region may be formed near one or more temperature-sensitive photonic structures.

Figure 3A:
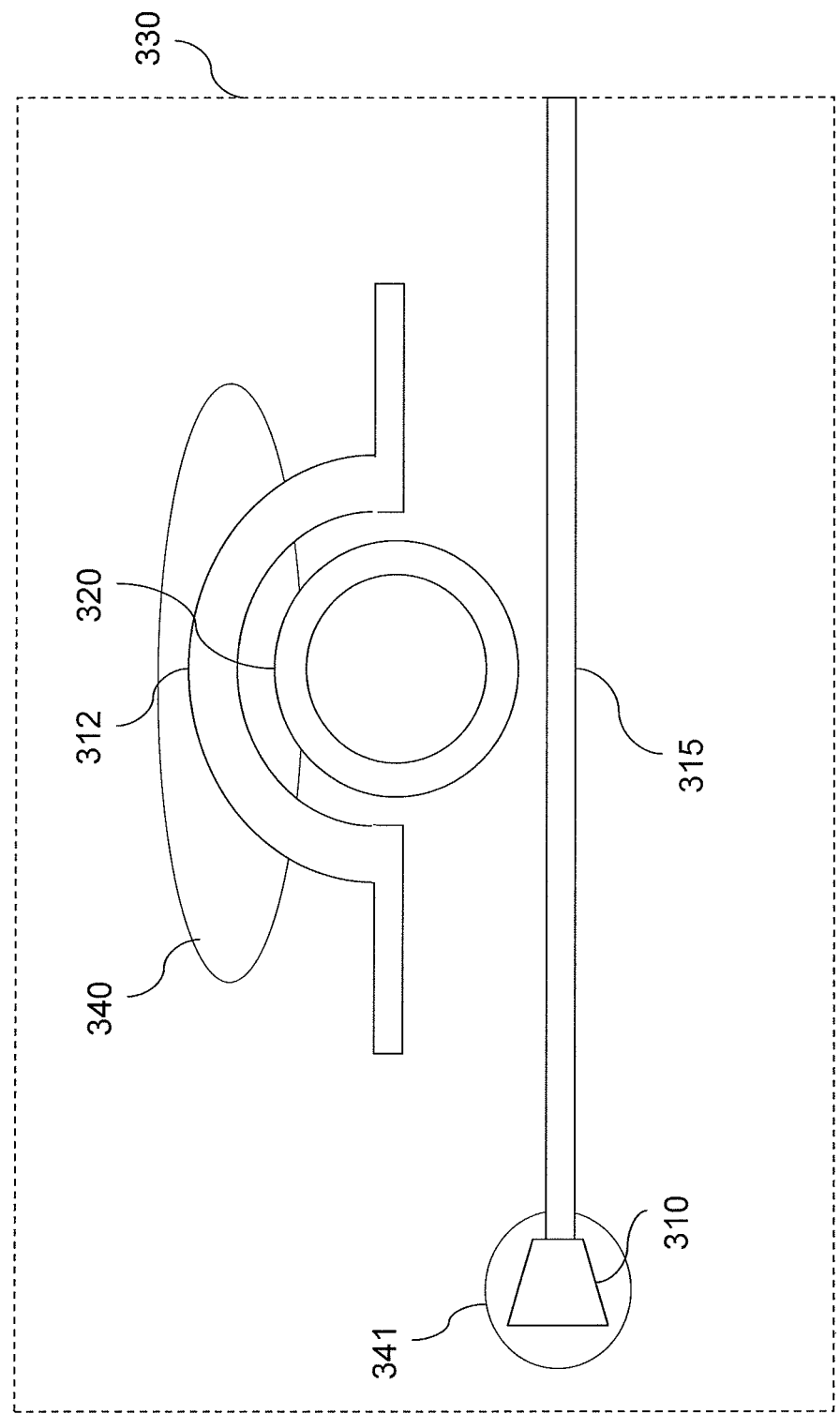
Figure 3B:
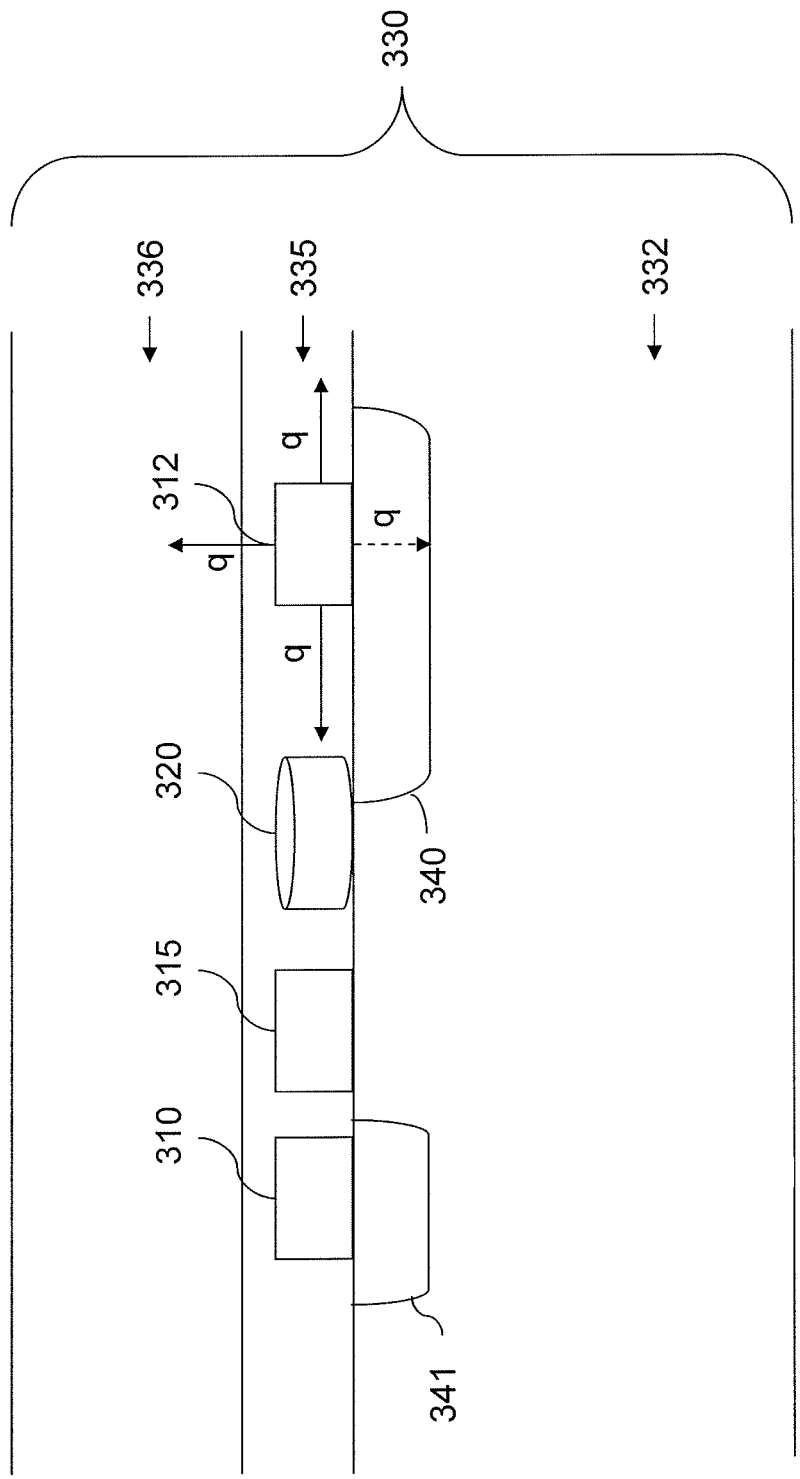

FIGS. 3A and 3B illustrate one embodiment. They show a top-down view and a cross-sectional view, respectively, of photonic devices formed in a portion of a die 330. As shown in FIG. 3A, die 330 may include one or more temperature sensitive photonic devices of a photonic system, including, for example, a resonant carrier wave modulator 320, such as a ring resonator or disk resonator, or another type of resonant modulator. Carrier wave modulator 320 may be an electro-optical modulator configured to receive an electrical data signal from an electrically connected interconnect, such as an electrically conductive signal line, and modulate a carrier wave in an adjacent optical waveguide 315 according to the received data. Alternatively, carrier wave modulator 320 may be an optical modulator configured to receive an optical data signal, such as from another optical waveguide.

Die 330 also includes one or more heating devices 312 providing active temperature control of one or more of the photonic devices, such as the carrier wave modulator 320. Heating device 312 can be a resistive element, such as a polysilicon, silicon, or copper element, that is configured to receive electrical energy from an electrically connected interconnect, such as a via, and output heat. Although carrier wave modulator 320 and heating device 312 are shown as separate elements FIG. 3A, it should be understood that heating device 312 may also be integrated with carrier wave modulator 320.

Die 330 also includes a carrier wave input device 310, such as a laser configured to output an optical carrier wave, which is another example of a temperature sensitive photonic device. Die 330 also includes an optical waveguide 315 configured to carry an optical carrier wave that is modulated by the carrier wave modulator 320. It should be understood that the described temperature-sensitive photonic devices, structures, and arrangements are merely exemplary, and the embodiments below may be applied in connection with any known temperature-sensitive photonic structures, including, e.g., temperature-sensitive photonic detectors, optical waveguides, filters, or other structures.

Figure 1:
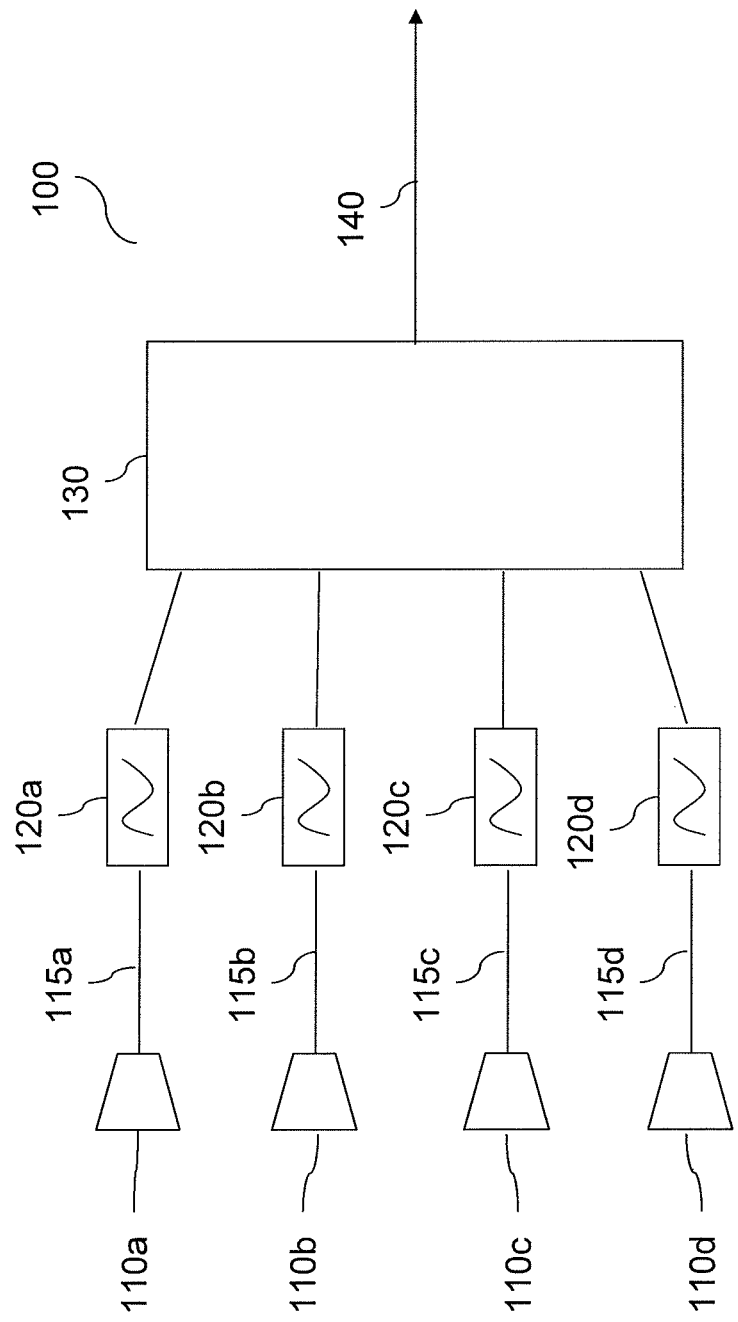
FIG. 1 illustrates a block diagram of a conventional photonic system.
Figure 2A:
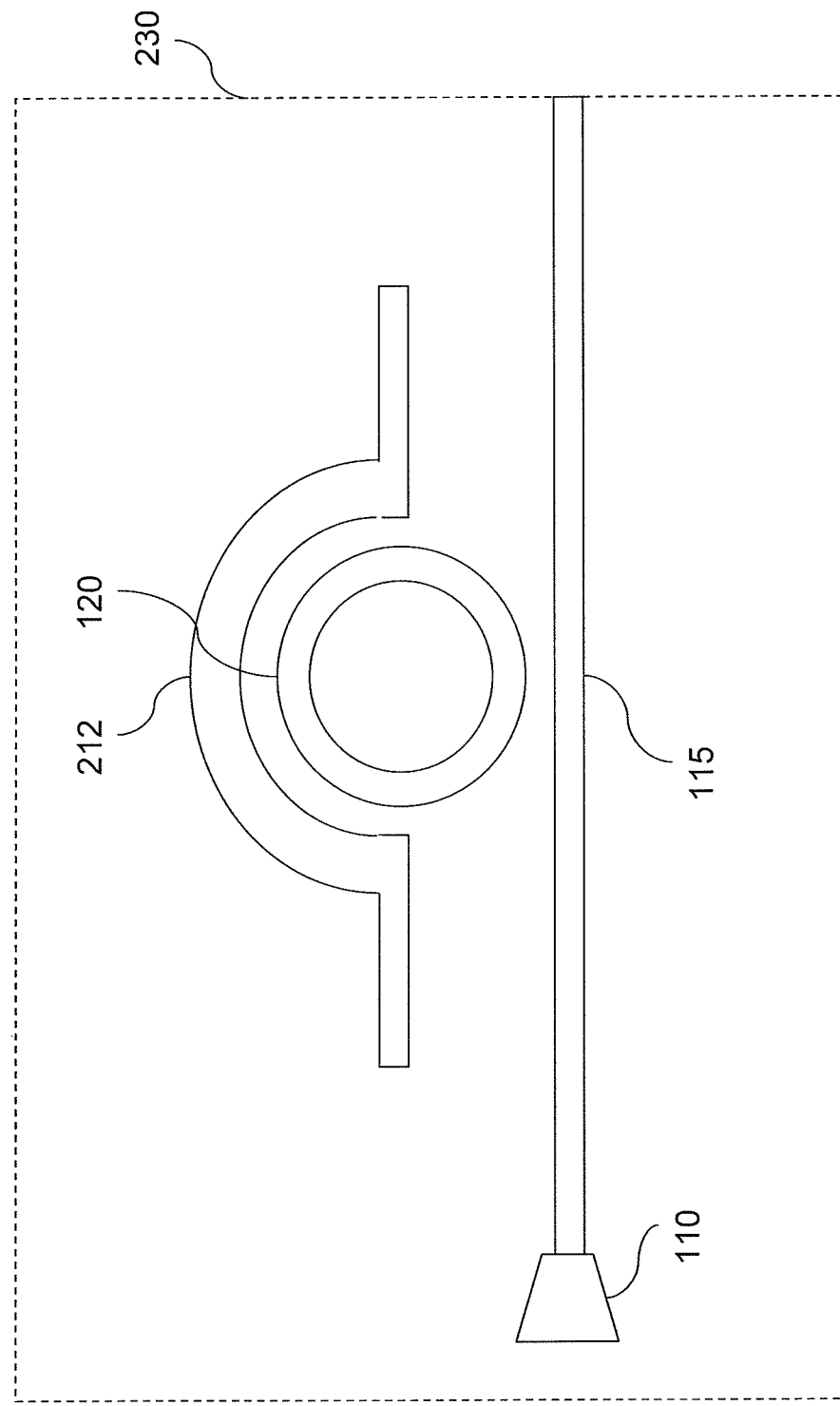
FIGS. 2A and 2B illustrate a top-down view and a cross-sectional view, respectively, of photonic devices in a die.
Figure 2B:
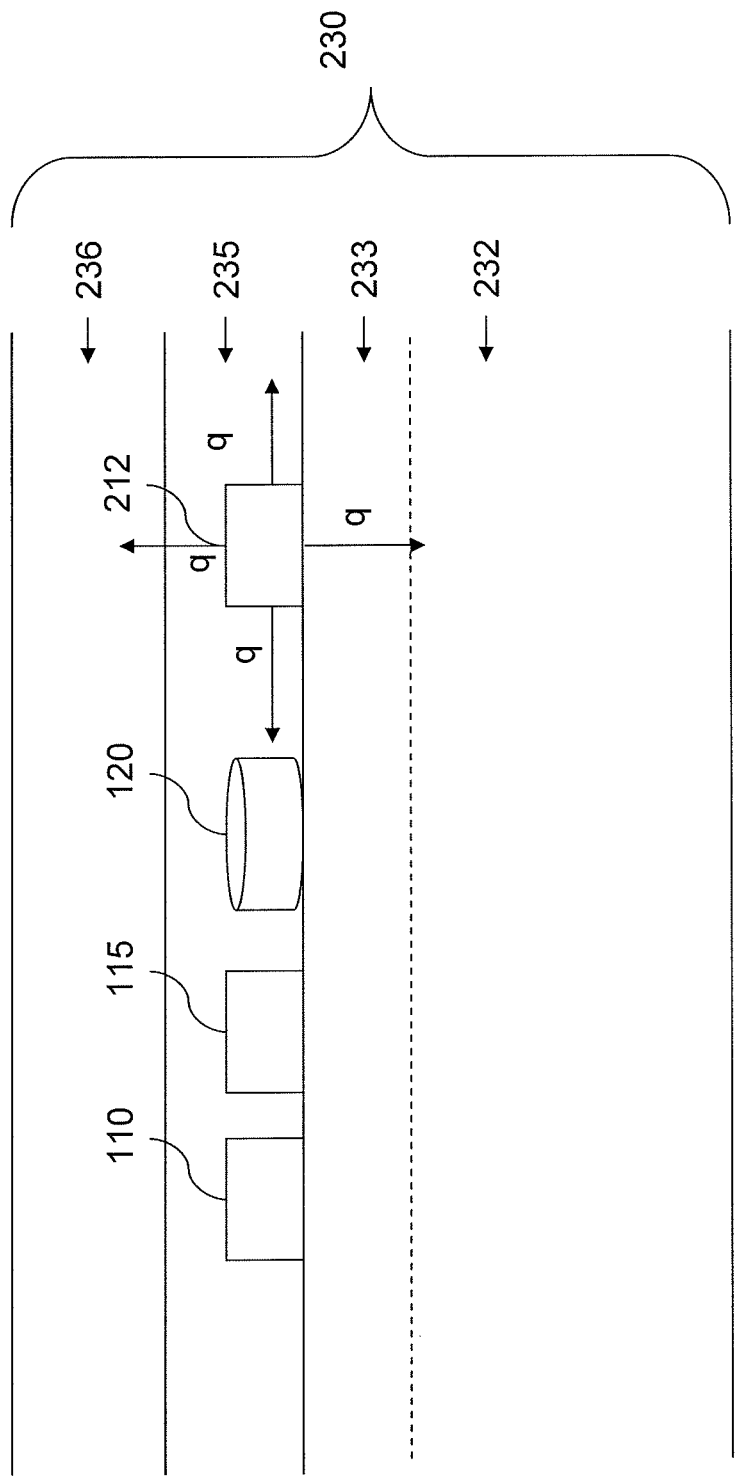

As shown in FIG. 3B, the photonic devices, such as input device 310, optical waveguide 315, and waveguide modulator 320, as well as heating device 312, may be formed in an integrated circuit. Die 330 includes a substrate 332, which may be, for example, a bulk region of thermally conductive silicon. Although not shown in FIG. 3B, substrate 332 may optionally include an insulator or "BOX" region 233 (FIG. 2B) composed of an electrically insulating material, such as SiO$_2$, providing a silicon-on-insulator (SOI) substrate. Photonic devices including input device 310, optical waveguide 315, and waveguide modulator 320 are formed in a device formation region 335 above a portion of the substrate 332. Device formation region 335 may include a silicon area for device formation, and a cladding material, such as SiO$_2$, to serve as cladding for an optical waveguide 315 that surrounds a silicon inner core and to optically and/or electrically insulate one or more of the photonic devices. Die 330 also includes one or more interlevel dielectric (ILD) regions 336 having, for example, $SiO_2$ as the lowest layer (i.e., the layer closest to device formation region 335).

As shown in FIGS. 3A and 3B, a thermal isolation region 340 is formed near or adjacent to heating device 312. Thermal isolation region 340 can be provided by forming an area of low thermal conductivity material in die 330. For example, as shown in FIG. 3B, thermal isolation region 340 can include low thermal conductivity material formed in an area of the substrate 332 below heating device 312. Thermal isolation region 340 prevents dissipation of heat from heating device 312 into the thermally conductive substrate 332. Thermal isolation region 340 may extend beyond the region of substrate 332 under heating device 312 into an area under one or more temperature sensitive photonic devices in die 330, such as under carrier wave modulator 320, in order to thermally isolate the temperature sensitive photonic devices from thermal changes in substrate 332. In addition, one or more additional thermal isolation regions 341 may be formed in an area of substrate 332 under temperature-sensitive photonic devices in die 330, in order to thermally isolate the temperature sensitive photonic devices from thermal changes in substrate 332. For example, a second thermal isolation region 341 may be formed in an area of substrate 332 under input device 310.

Thermal isolation regions 340, 341 may be composed of, for example, a low thermal conductivity material, such as a material having low dielectric constant relative to the silicon of the substrate 332. For example, the dielectric constant k of silicon used to foam substrate 332 of die 330 is typically approximately 11.7, and the $SiO_2$ used to form the insulator region 333 (FIG. 4B) of an SOI substrate, the cladding in device region 335, and/or the ILD region 336, is approximately 3.9. Techniques discussed below may provide a low thermal conductivity material 340 having a dielectric constant k in a range of approximately 1.0 to 3.8. Low thermal conductivity material 340 may also include a thermal conductivity that is lower than silicon used in the die 330. For example, low thermal conductivity material 340 may have a thermal conductivity less than approximately 0.006 W/cm° C.

One technique for forming low thermal conductivity material for a thermal isolation region 340, 341 is by doping an area of silicon or $SiO_2$ with a lower dielectric constant material than the material being doped. Examples of materials having lower dielectric constants than silicon and $SiO_2$ include fluorine and carbon. Doping silicon or $SiO_2$ with these or other lower dielectric constant materials reduces the dielectric constant of the doped material, thereby reducing the thermal conductivity of the doped material.

Another technique for forming low thermal conductivity material is to create an area of porous $SiO_2$. Certain techniques for depositing $SiO_2$, such as plasma enhanced chemical vapor deposition (PECVD), form $SiO_2$ with voids or pores filled with ambient air or other gaseous material (referred to as porous $SiO_2$). The voids in porous $SiO_2$ may have a dielectric constant of nearly 1.0, resulting in porous $SiO_2$ having a lower dielectric constant than non-porous $SiO_2$. Further, porous $SiO_2$ may be doped with a low dielectric constant dopant, such as fluorine or carbon, to further reduce the thermal conductivity.

Another technique for forming low thermal conductivity material is to deposit $SiO_2$ using a spin-on deposition technique (referred to as "spin-on $SiO_2$"). Spin-on deposition techniques are typically used in silicon manufacturing processes to deposit materials such as photoresist, while techniques such as chemical vapor deposition are typically used to deposit $SiO_2$. Some examples of spin-on low dielectric constant polymers include polyimide, polynorbornenes, benzocyclobuten, and/or polytetrafluoroethylene (PTFE). Spin-on deposition of $SiO_2$ results in the $SiO_2$ having a lower dielectric constant, and lower thermal conductivity. Further, $SiO_2$ deposited using a spin-on deposition technique may be doped with a low dielectric constant dopant, such as fluorine or carbon, to further reduce the thermal conductivity.

FIG. 3C shows another embodiment of photonic devices formed in a die 330 including a thermal isolation region 342. Thermal isolation region 342 includes a low thermal conductivity material formed in an area of substrate 332 extending beneath heating device 312, input device 310, optical waveguide 315 and carrier wave modulator 320. Thermal isolation region 342 provides thermal isolation of substrate 332 from heating device 312, as well as thermal isolation of input device 310, optical waveguide 315 and resonant carrier wave modulator 320 from temperature variations in substrate 332. Other methods known in the art of depositing low thermal conductivity material may also be used.

Figure 3D:
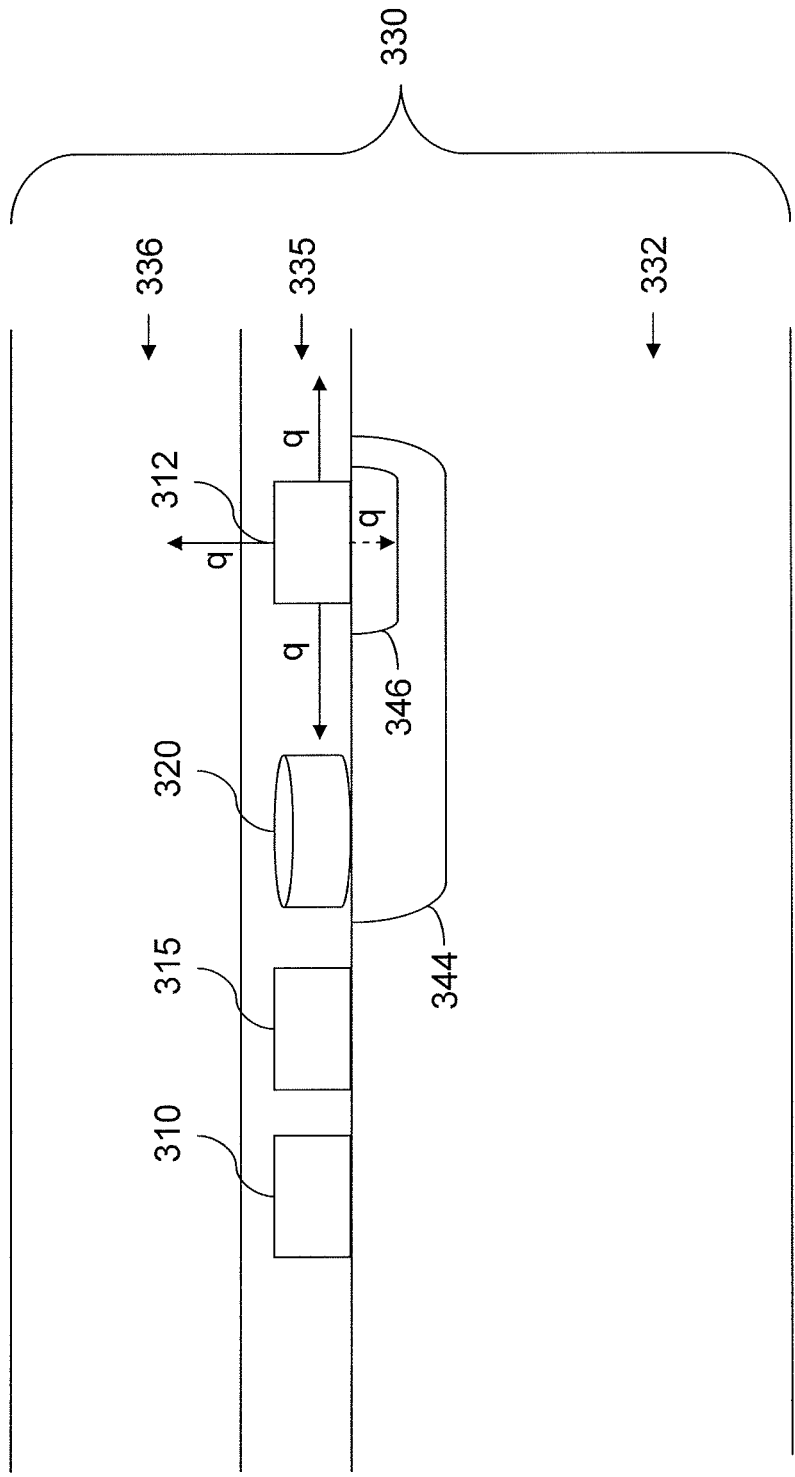

More than one of the techniques described above for forming a low thermal conductive material may be used in combination to provide thermal isolation in die 330. For example, FIG. 3D illustrates a cross-sectional view of die 330, where a first thermal isolation region 344 is formed under heating device 312 and extends under one or more of the photonic structures 310, 315, 320. A second thermal isolation region 346 is formed within the first thermal isolation region 344, localized under heating device 312. Second thermal isolation region 346 may have a lower thermal conductivity than the material of the first thermal isolation region 344. For example, first thermal isolation region 344 may be composed of a porous $SiO_2$ material or an $SiO_2$ material deposited using a spin-on deposition technique, and the porous or spun-on material in the second thermal isolation region 346 is doped using, e.g., a fluorine or carbon dopant to provide a lower thermal conductivity.

Figure 3E:
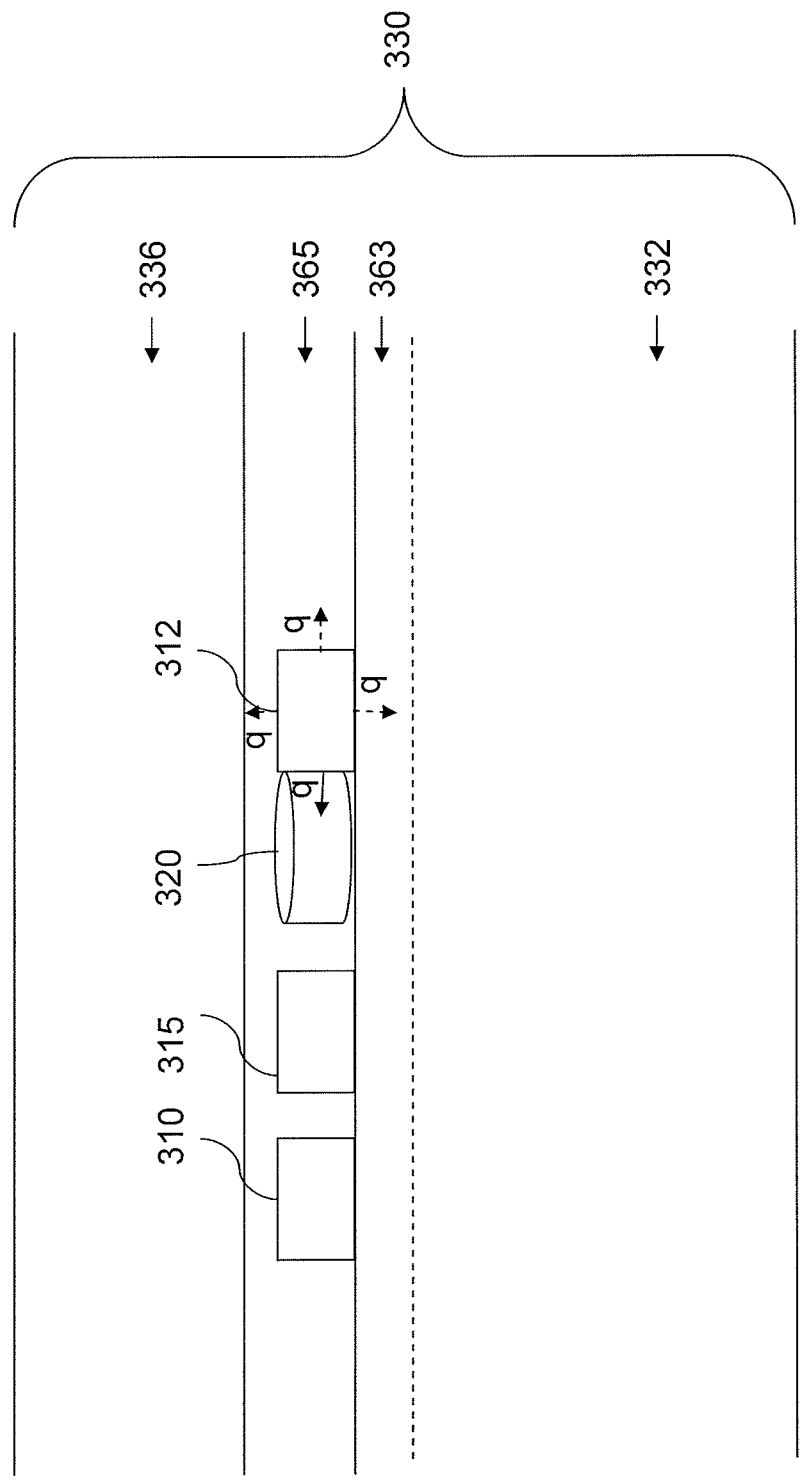

FIG. 3E shows another embodiment of photonic devices formed in a die 330 including a thermal isolation region. Die 330 includes a resonant carrier wave modulator 320 integrated with a heating device 312. In FIG. 3E, device formation region 365 includes a low thermal conductivity material. For example, after the formation of silicon photonic devices above substrate 332, outer cladding for optical waveguide 315 and insulating material for the other photonic devices in die 300 can be provided in device formation region 365 by depositing spin-on $SiO_2$ or porous $SiO_2$ in device formation region 365. Alternatively, portions or all of a region of $SiO_2$ material used to form device formation region 365 may be doped with fluorine or carbon. Forming device formation region 365 with a low thermal conductivity material reduces undesirable dissipation of heat from heating device 312, and thermally isolates temperature-sensitive photonic devices in die 330 from temperature variations in substrate 332 and/or interlevel dielectric 336.

Further, die 330 includes an insulation region 363 providing a silicon-on-insulator substrate, where the insulation region 363 is formed with low thermal conductivity material. For example, insulation region 363 may be formed from spin-on $SiO_2$ or porous $SiO_2$, or from $SiO_2$ doped with fluorine or carbon. Forming insulation region 363 with a low thermal conductivity material further reduces undesirable dissipation of heat from heating device 312, and thermally isolates temperature-sensitive photonic devices in die 330 from temperature variations in substrate 332.

Figure 4A:
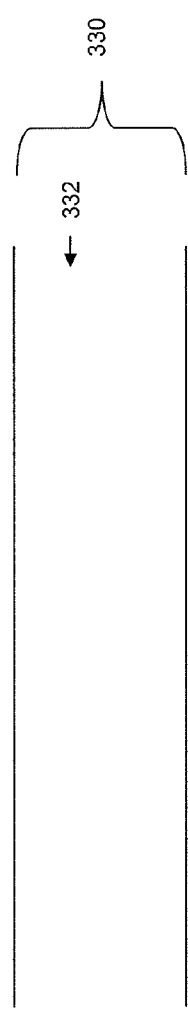

FIGS. 4A-4E illustrate examples of manufacturing processes for embodiments of die 330 including thermal isolation regions. In FIG. 4A, a silicon substrate 332 is provided.

Figure 4B:
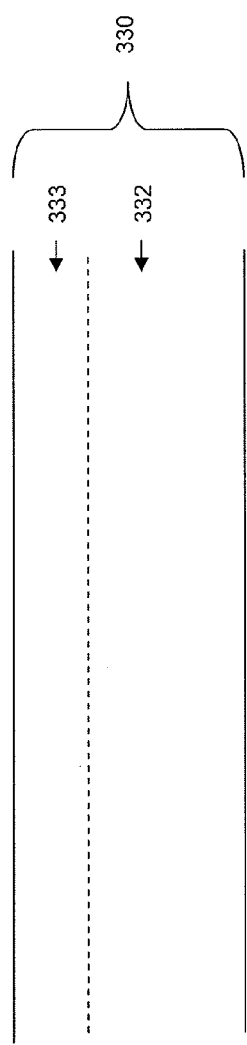

In FIG. 4B, an optional insulation 333 may be formed over silicon substrate 332, such as by thermally growing or depositing $SiO_2$ over substrate 332 using a chemical vapor deposition or other known process, to provide a silicon-on-insulator die. In another embodiment, a portion or all of insulation 333 in FIG. 4B is formed from a low thermal conductivity material. For example, a portion or all of insulation 333 can be formed using a plasma enhanced chemical vapor deposition (PECVD), to form porous $SiO_2$, or by depositing $SiO_2$ using a spin-on deposition technique. In other embodiments, the insulation 333 may be omitted.

Figure 4C:
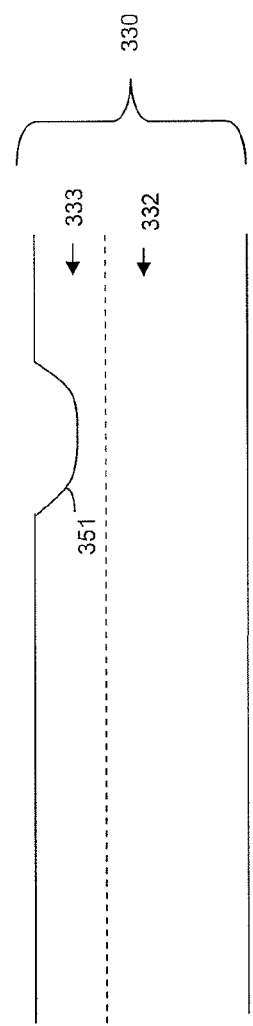

In FIG. 4C, a trench 351 may be formed, for example by etching, in substrate 332, or, if present, into insulation 333 for an SOI substrate. Trench 351 can be formed using, for example, a dry etch process or other known etching techniques. In FIG. 4D, a layer 355 of low thermal conductivity material is deposited over substrate 332 and into trench 351. In one embodiment, the low thermal conductivity material is $SiO_2$ doped with a lower dielectric constant dopant, e.g., fluorine or carbon, that is deposited using standard techniques, such as chemical vapor deposition. In another embodiment, the low thermal conductivity material is porous $SiO_2$ deposited using a PECVD technique. In another embodiment, the low thermal conductivity material is $SiO_2$ deposited using a spin-on technique. In FIG. 4E, the excess low thermal conductivity material from layer 355 is removed from substrate 332 using known techniques, such as a chemical or mechanical polish, leaving thermal isolation region 340.

In FIG. 4F, photonic devices, such as an input device 310, an optical waveguide 315, a carrier wave modulator 320, or other photonic devices are formed above substrate 332. Heating device 312 is formed above thermal isolation region 340.

Figure 4G:
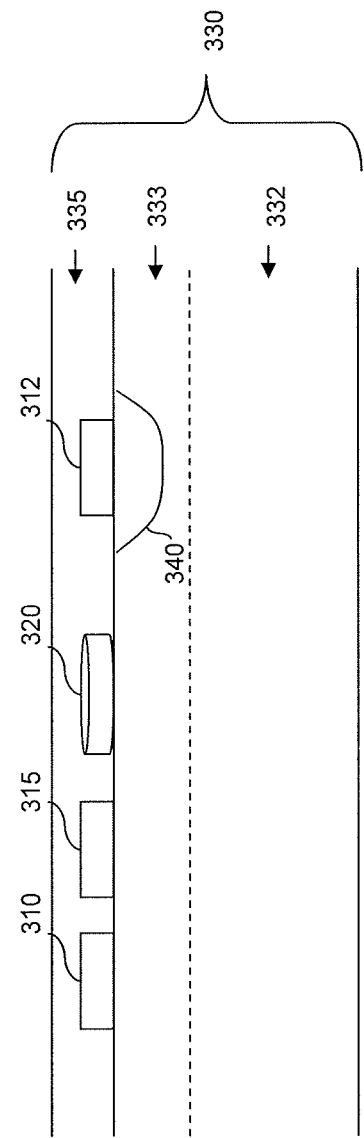

In FIG. 4G, device formation layer 335 is completed by depositing insulating and cladding material, such as $SiO_2$, surrounding the formed photonic devices 310, 315, 320. In another embodiment, a low thermal conductivity material, such as a doped $SiO_2$, porous $SiO_2$, or spin-on $SiO_2$ is used as an insulating and cladding material to complete the device formation region. Other regions, such as an ILD region 336 (FIG. 3B), can then be formed over the device formation region 335.

Figure 5:
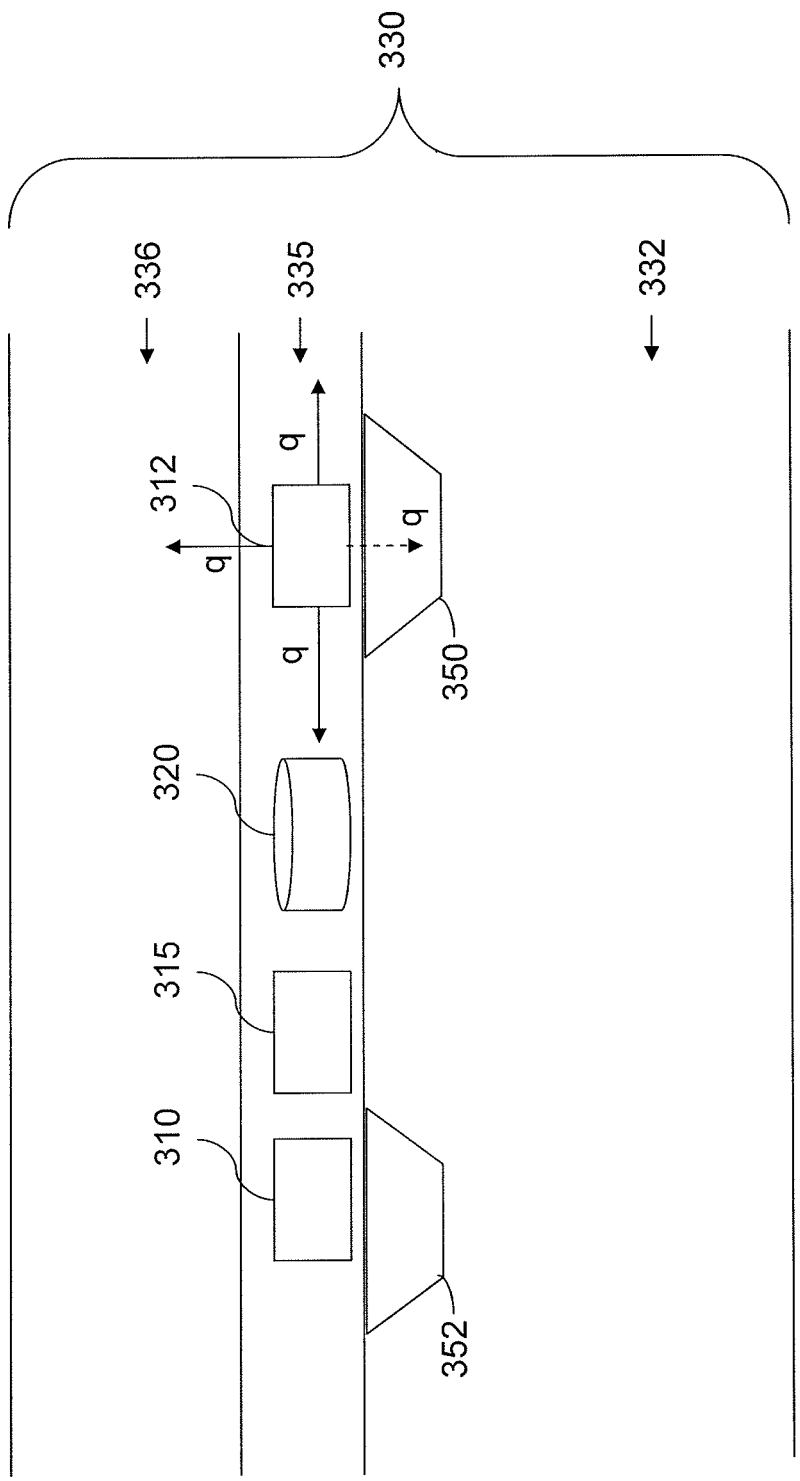
FIG. 5 illustrates a cross-sectional view of a die including a thermal isolation region, in accordance with embodiments described herein

FIG. 5 shows another embodiment of a die including temperature isolation regions. In FIG. 5, a shallow trench isolation (STI) region 350 is formed in an area of substrate 332 under heating device 312. In existing CMOS manufacturing processes, STI regions composed of $SiO_2$ are used to electrically isolate devices within die 330. In the embodiment shown in FIG. 5, an STI region 350 composed of a low thermal conductivity material, such as a doped $SiO_2$, porous $SiO_2$, spin-on $SiO_2$, or other low thermal conductivity material, is formed in an area of substrate 332 below heating device 312. STI region 350 thermally isolates substrate 332 from heating device 312, and reduces unwanted dissipation of heat from heating device 312 into substrate 332. In addition to, or instead of, STI region 350 under heating device 312, die 330 can include an STI region 352 formed in an area of substrate 332 below one or more photonic devices, such as in an area below input device 310, in order to thermally isolate the photonic devices from thermal variations in substrate 332. STI regions 350, 352 can be partially, or substantially completely, formed from low thermal conductivity material.

FIGS. 6A-6E illustrate additional embodiments of die 430 including temperature sensitive photonic devices and thermal isolation regions. Exemplary photonic structures shown in FIGS. 6A-6E include an input device 410, an optical waveguide 415, and/or a resonant carrier wave modulator 420, although it should be understood that any other photonic structures may be included, such as a photonic detector or optical filter. Die 430 also includes one or more heating devices 412, which may be separate heating elements or integrated with a carrier wave modulator 420. Die 430 includes a substrate 432, device formation region 435, and ILD region 436, which may be formed of similar materials discussed above in connection with FIGS. 3A-3E. Although not shown for purposes of clarity, substrate 432 may optionally include an insulation region 233 (FIG. 2B) providing an SOI substrate.

Figure 6A:
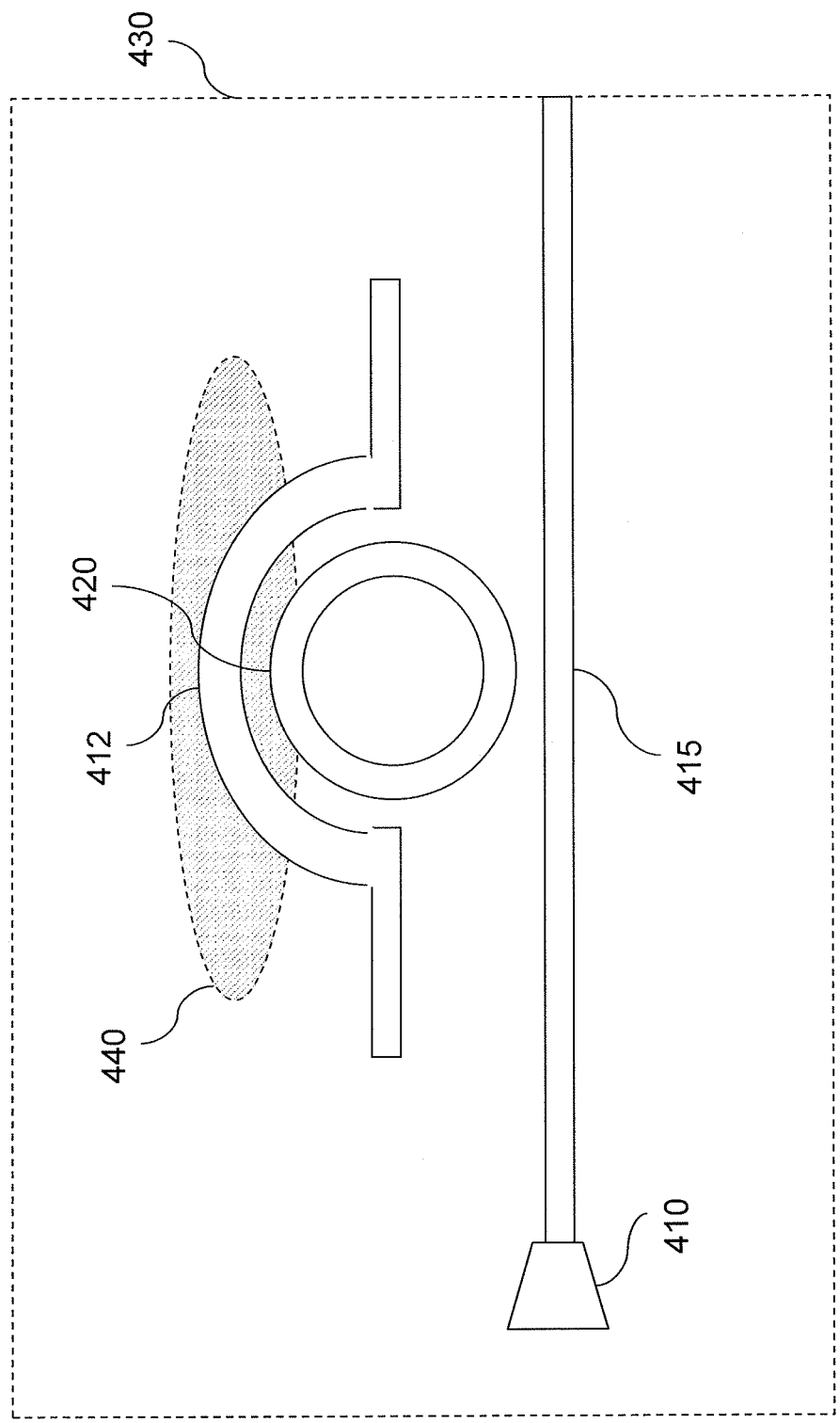
FIGS. 6A-6E illustrate a top-down view, cross-sectional views, and a three-dimensional view, respectively, of die including thermal isolation regions, in accordance with embodiments described herein.
Figure 6B:
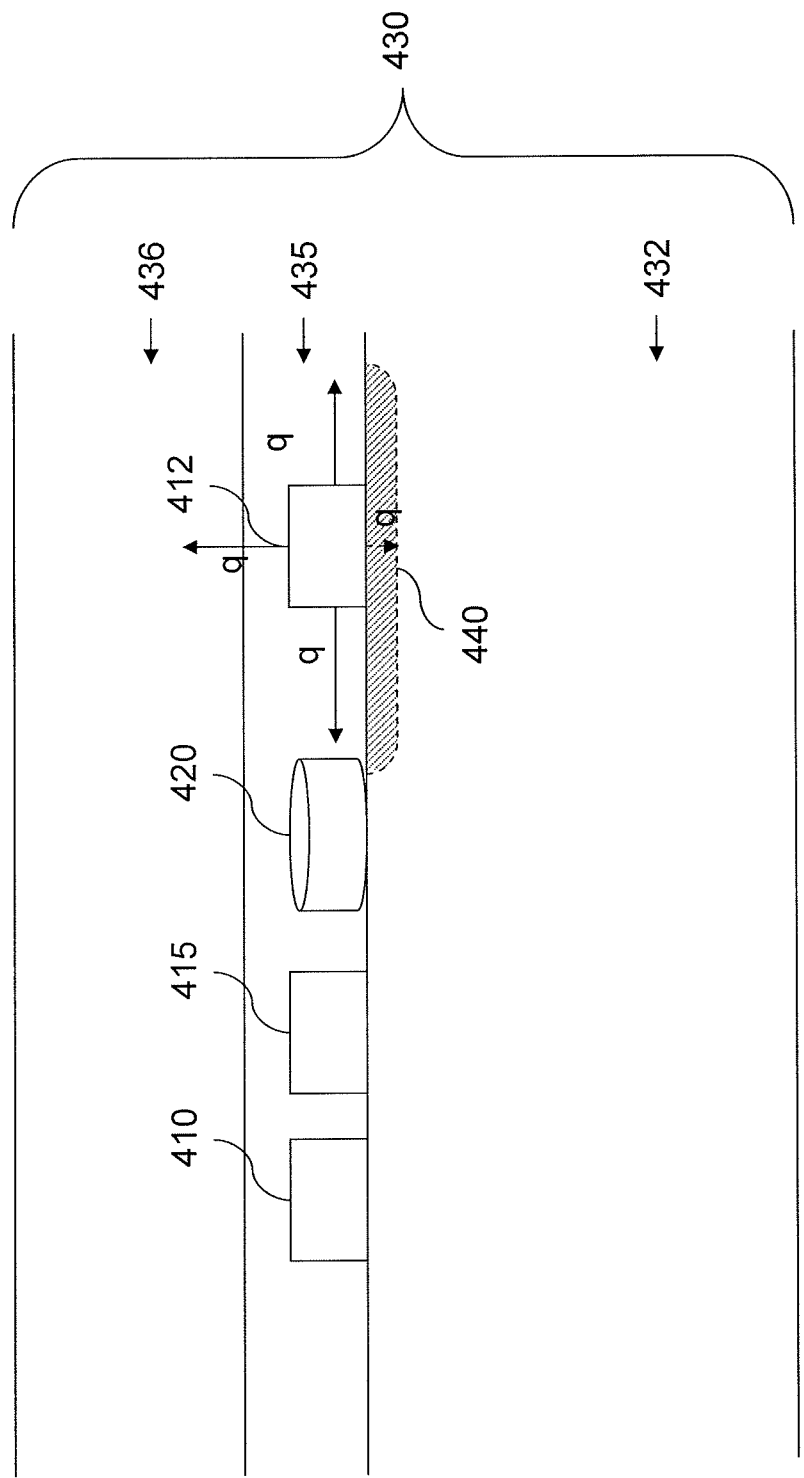

In FIGS. 6A and 6B, a thermal isolation region is provided by forming a physical gap 440 to create a thermal break between heating device 412 and adjacent material. At the temperature and dimensions used in silicon photonic systems, conduction is the most efficient heat flux mechanism. A thermal break involves removing a portion of the conductive material, leaving a gap or void that prevents thermal conduction across the gap. In another embodiment, gap 440 is formed in a portion of an insulation region 233 (FIG. 2A) of an SOI substrate underlying heating device 412. Gap 440 may be localized in an area of substrate 432 under heating device 412, or may extend into the area of substrate 432 under one or more photonic devices, such as carrier wave modulator 420, in order to thermally isolate the photonic devices from thermal variations in substrate 432.

Because a thermal break drastically reduces the dissipation of heat q in its respective direction, a relatively small gap is sufficient for thermal isolation of substrate 432. Gap 440 may be, for example, an air gap in substrate 432 on the order of a few nanometers, so long as the gap is sufficient to prevent thermal conduction.

Figure 6C:
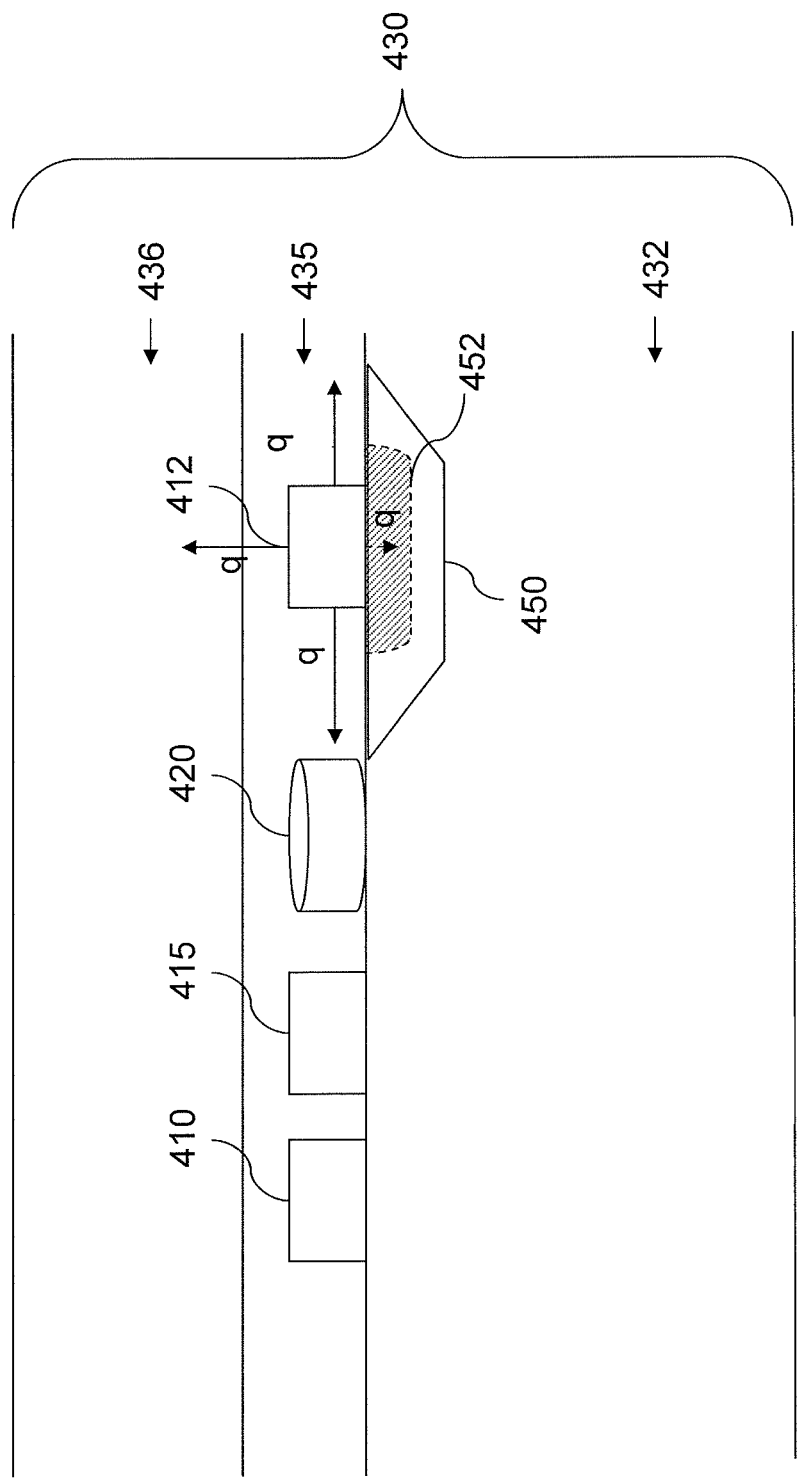

In another embodiment shown in FIG. 6C, a gap 452 is provided within a shallow trench isolation (STI) region 450. STI region 450 may be composed of an electrically insulating material, such as $SiO_2$ or other oxides. STI region 450 with gap 452 reduces the dissipation of heat q from heating device 412 into substrate 432 through STI region 450. Alternatively, STI region 450 may be composed of a low thermal conductivity material, as discussed above in connection with FIG. 5, such that gap 452 and STI region 450, in combination, provide for thermal isolation of substrate 432 from heating device 412.

Figure 6D:
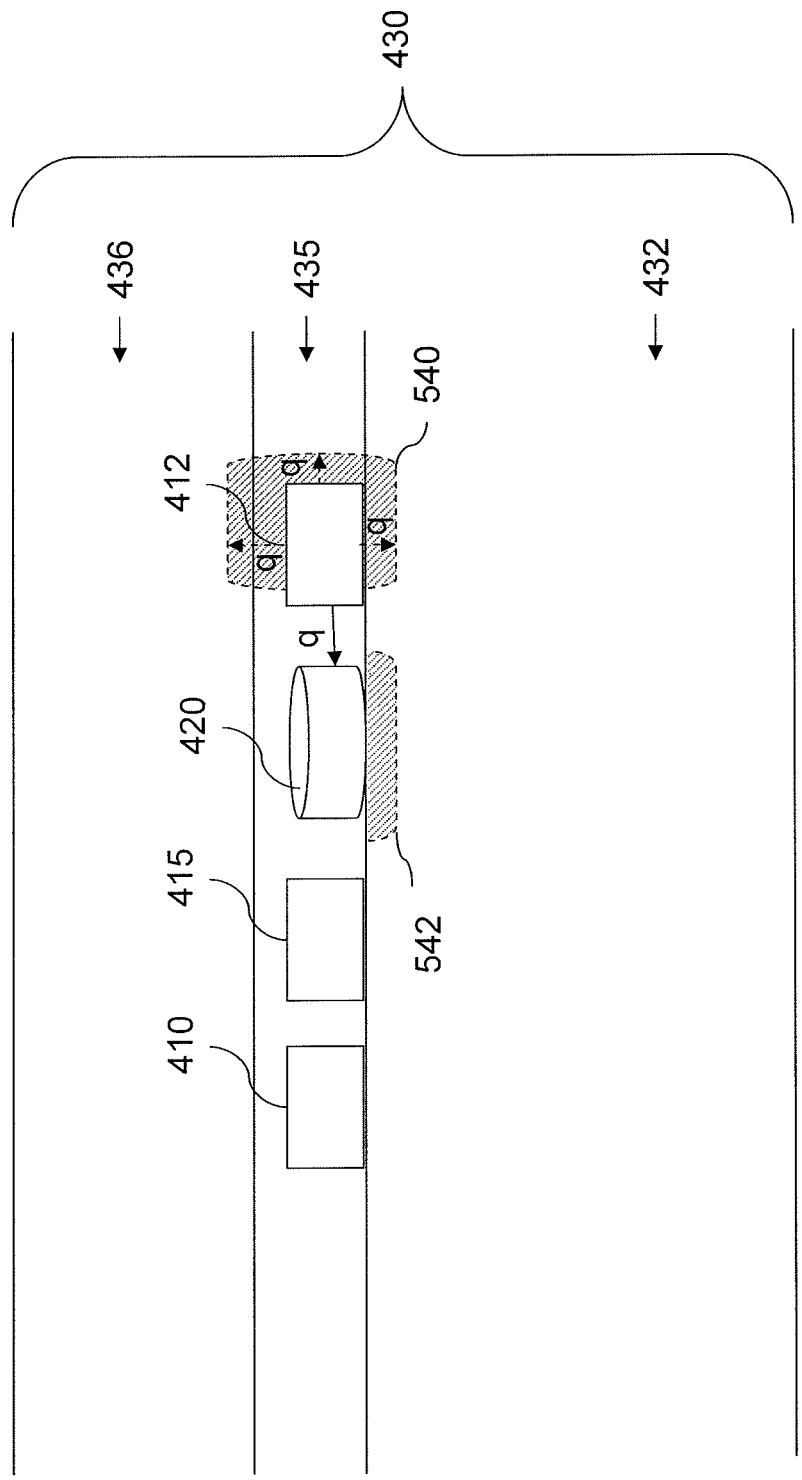

In another embodiment shown in FIG. 6D, die 430 includes a gap 540 surrounding heating device 412 on multiple sides, including in portions of substrate 432, device formation region 435, and ILD region 436 surrounding heating device 412. Gap 540 provides thermal isolation to reduce heat dissipated by heating device 412 into substrate 432, as well as into ILD region 436 and other adjacent portions of device formation region 435 that are not meant to receive active temperature control from heating device 412, allowing for more efficient active temperature control and reduced global temperature flux. Gap 540 also improves the thermal isolation of overlying circuitry (i.e., formed in or above ILD region 436) and neighboring circuitry (i.e., in adjacent portions of die 430) from heating device 412, reducing the thermal effect of heating device 412 on the overlying and neighboring circuitry. Because the dissipation of heat q in the direction of the temperature-sensitive photonic structures that heating device 412 is intended to actively regulate is still desirable, gap 540 should provide little or no separation between heating device 412 and device formation region 435 in the direction of thermally-sensitive photonic structures to which it is providing active temperature control, such as carrier wave modulator 420.

As also shown in FIG. 6D, a second thermal isolation region can be provided by forming a separate gap 542 in the area of substrate 432 under one or more of the temperature-sensitive photonic devices, such as under carrier wave modulator 420. The second thermal isolation region 542 thermally isolates carrier wave modulator 420 from thermal variations in the substrate 432.

Figure 6E:
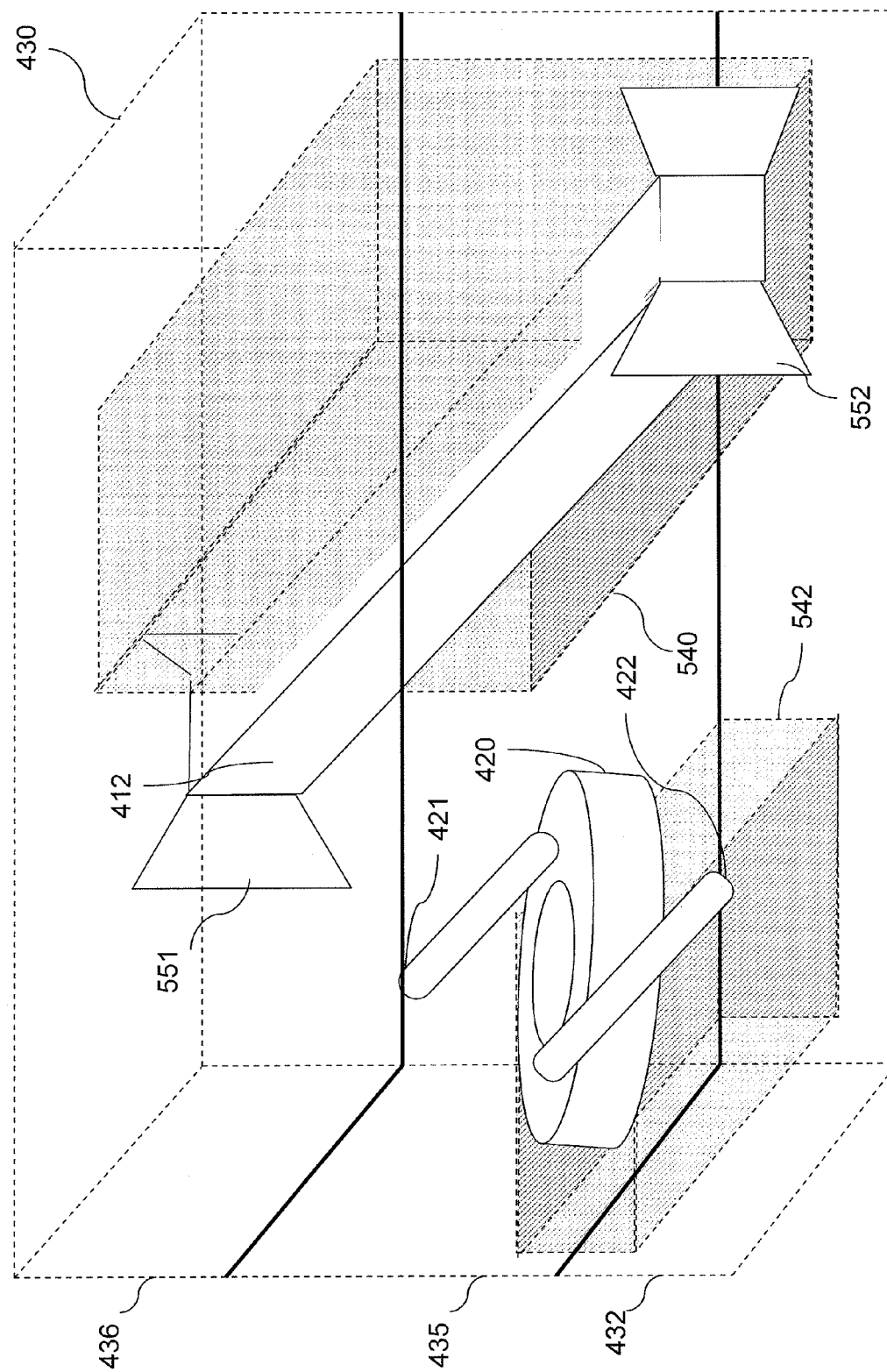

In the embodiments described above in connection with FIGS. 6A-6D, the respective gap may be etched such that sufficient material remains to provide mechanical support for overlying devices, such as heating device 412. As discussed above, a gap on the order of a few nanometers may be sufficient to provide thermal isolation of surrounding materials. Furthermore, as shown in FIG. 6E, interconnects 551, 552 that are used to provide electrical energy to heating device 412 extend into the material of device formation region 432 and/or ILD region 436 that surrounds gap 540. Interconnects 551, 552 provide mechanical support for heating device 412 despite a gap 540 surrounding substantially all sides of heating device 412. Similarly, signal lines 421, 422 that are configured to provide an electrical data signal to carrier wave modulator 420 extend into the material of device formation region 432 and/or ILD region 436, providing mechanical support for carrier wave modulator 420 despite the underlying gap 542 in substrate 432. Because heating device 412, carrier wave modulator 420 and other photonic devices are manufactured on a microscopic scale, the devices have relatively little mass, and thus the interconnects 551, 552 for heating device 412 and signal lines 421, 422 for carrier wave modulator 420 can provide mechanical support for the respective devices. Other photonic devices will typically include similar physical connections that extend into the surrounding material of device formation region 432 and/or ILD region 436, providing mechanical support for the photonic devices.

FIGS. 7A-7E illustrate a process for forming a thermal isolation region including a gap 440. In embodiments shown in FIGS. 7A-7E, a gap 440 is formed in substrate 432, by performing an etching process in substrate 432 after completing formation of the device formation region 435, including photonic devices such as input device 410, optical waveguide 415, and carrier wave modulator 420, and heating device 412. It should be understood, however, that gap 440 may instead be formed in substrate 432, or in an insulator region 233 (FIG. 2A), prior to the formation of photonic devices 410, 415, 420 and heating device 412 in device formation region 435, such as by performing a vacuum or etching process after providing the substrate 432.

Figure 7A:
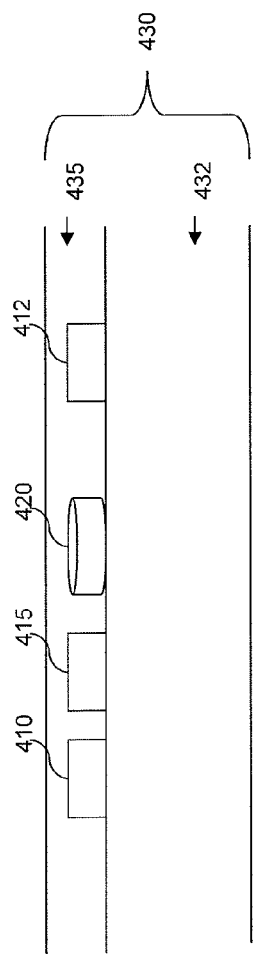

In FIG. 7A, photonic devices, such as an input device 410, an optical waveguide 415, a carrier wave modulator 420, or other photonic devices, and a heating device 412 for providing active temperature control, are formed in device formation region 435 of a die 430. A material such as $SiO_2$ is deposited to complete the device formation region 435.

Figure 7B:
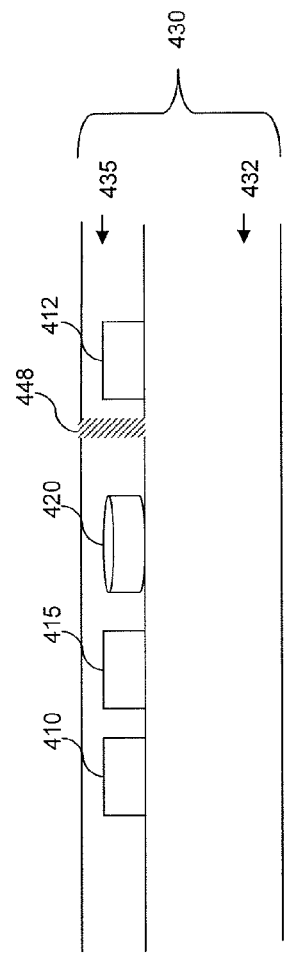

In FIG. 7B, an opening 448 is formed starting at a top surface of device formation region 435 in a location proximate to, but not directly over, heating device 412. Opening 448 traverses device formation region 435, and is formed using, for example, reactive ion etching or other techniques.

Figure 7C:
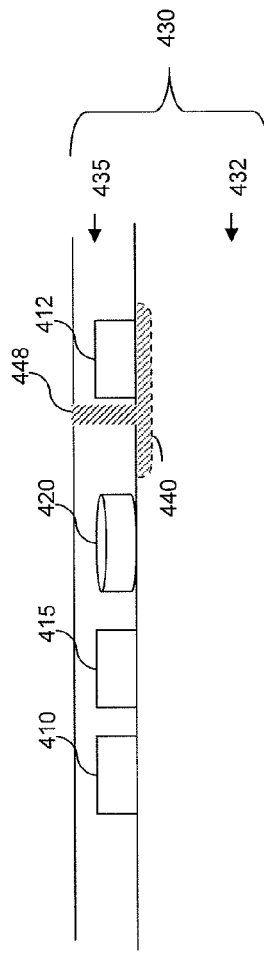

In FIG. 7C, gap 440 is formed through opening 448, such as by using a pulse etch process where the etching fluid passes through opening 448, or through a dry etch process.

After completion of the etching process, opening 448 may be filled with a dielectric material, as shown in FIG. 7D. For example, opening 448 can be filled with $SiO_2$ through a chemical vapor deposition process. Alternatively, opening 448 may be left open during further processing.

In FIG. 7E, an ILD region 436 is formed over the device formation region 435 and opening 448. It should be understood that the process described in connection with FIGS. 7A-7E could also be performed after formation of an ILD region 436 over device formation region 435.

It should also be understood that, while FIGS. 7A-7E show the formation of a gap 440 in a region of substrate 432 under heating device 412, the techniques described in connection with FIGS. 7A-7E can be used to form a gap 440 in any desired location in die 430, such as under one or more of the photonic devices, in device formation region 435 or ILD region 436, in an STI region, or in the various locations described in connection with FIGS. 6A-6E.

Figure 8:
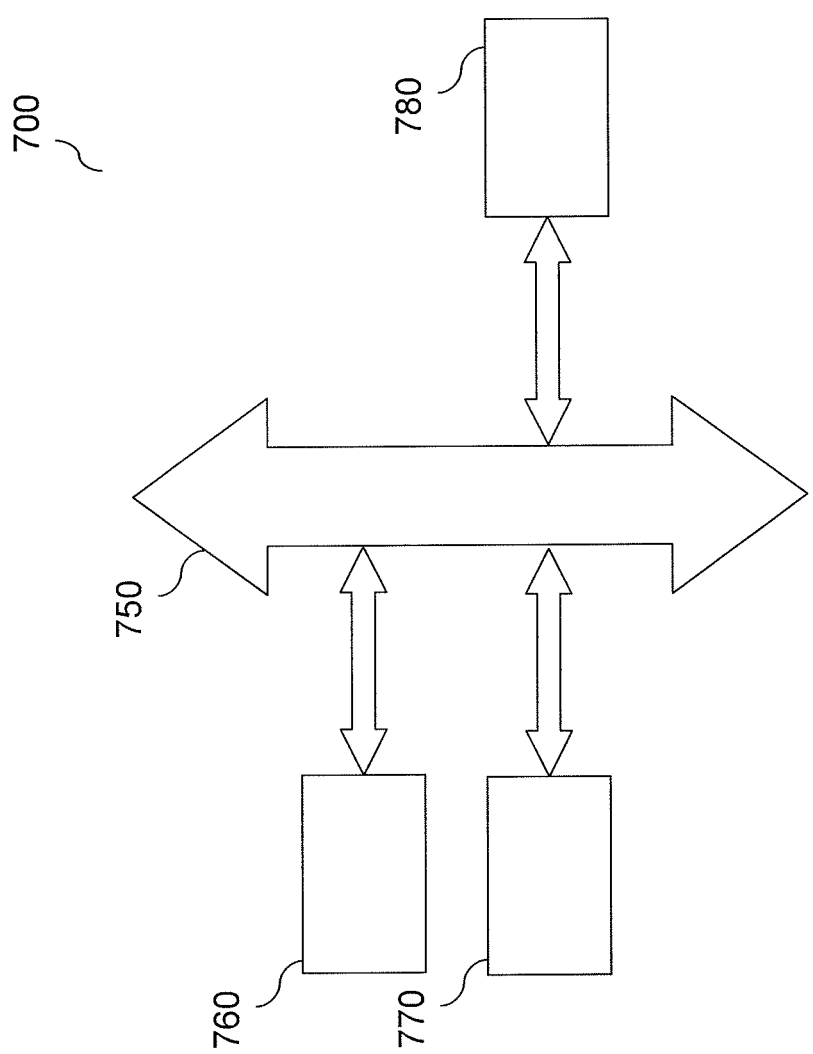
FIG. 8 illustrates a processor system, in accordance with embodiments described herein.

Die including the thermal isolation regions described above may be implemented as part of an integrated circuit. The corresponding integrated circuit may be utilized in a typical processor system. For example, FIG. 8 illustrates a typical processor system 700 including a processor and/or a memory device employing one or more of the thermal isolation structures and techniques described in connection with FIGS. 3-7.

Processor system 700, which may be, for example, a computer system, includes a central processing unit (CPU) 760, such as a microprocessor, a digital signal processor, or other programmable digital logic devices, which communicates with one or more input/output devices 780 over a bus 750. A memory device 770 also communicates with CPU 760 over bus 750, such as through a memory controller. The memory device 770 may include, for example, RAM, a hard drive, a FLASH drive or removable memory. In the case of a computer system, processor system 700 may include other peripheral devices, such as removable media devices, that communicate with CPU 760 over bus 750. In some embodiments, memory device 770 may be combined with CPU 760 as a single integrated circuit. Integrated circuits implementing the thermal isolation structures and techniques described herein may be used to provide efficient and reliable thermal isolation of photonic devices, electronic devices, and materials in one or more of CPU 760, memory device 770, input/output devices 780, or in connection with many other aspects of a processor system 700.

The above description and drawings are only to be considered illustrative of specific embodiments, which achieve the features and advantages described herein. Modification and substitutions to specific processes, components, and structures can be made. For example, it should be understood that appropriate types of semiconductor materials and memory elements other than those specifically described in connection with the above embodiments may be used. Accordingly, the embodiments of the invention are not to be considered as being limited by the foregoing description and drawings, but only by the scope of the appended claims.

What is claimed as new and desired to be protected by Letters Patent of the United States is:

1. An integrated structure comprising:
a substrate having an upper surface;
a first trench formed in the upper surface of the substrate;
a device formation region over the upper surface of the substrate;
a first temperature-sensitive photonic device formed in the device formation region;
a waveguide formed in the device formation region and separated from the trench by a portion of the substrate;
a heating device formed in the device formation region for heating the first temperature-sensitive photonic device, wherein the heating device is located over the first trench; and a first thermal isolation region formed under the heating device, wherein the first thermal isolation region is located in the first trench, such that the first thermal isolation region is provided in the upper surface of the substrate, and wherein the first thermal isolation region reduces dissipation of heat from the heating device into the substrate.

2. The integrated structure of claim 1, wherein the first trench and first thermal isolation region are formed under the heating device and at least a portion of the first temperature-sensitive photonic device, and wherein the first thermal isolation region is not formed under the wavelength.

3. The integrated structure of claim 1, wherein the first thermal isolation region comprises a low thermal conductivity material within the first trench.

4. The integrated structure of claim 3, wherein the low thermal conductivity material comprises an oxide doped with a material having a lower thermal conductivity than the oxide.

5. The integrated structure of claim 3, wherein the low thermal conductivity material comprises porous silicon dioxide.

6. The integrated structure of claim 3, wherein the low thermal conductivity material comprises spin-on silicon dioxide.

7. The integrated structure of claim 1, wherein the heating device is mechanically supported by at least one interconnect extending into the device formation region.

8. The integrated structure of claim 2, wherein the first trench and first thermal isolation region are formed under the entirety of the first temperature sensitive photonic device.

9. The integrated structure of claim 8, further comprising a second photonic device formed in the device formation region and wherein the first trench and first thermal isolation region are formed under the second photonic device.

10. The integrated structure of claim 1, further comprising a second photonic device formed in the device formation region and further comprising a second trench provided in an upper surface of the substrate and a second thermal isolation region under the second photonic device.

11. The integrated structure of claim 2, wherein the substrate comprises a bulk silicon substrate and the first trench and first thermal isolation region are provided in an upper surface of the silicon.

12. The integrated structure of claim 2, wherein the substrate comprises a silicon on insulator substrate and the first trench and first thermal isolation region are provided in the insulator of the silicon on insulator substrate.

13. The integrated structure of claim 2, wherein the first trench and first thermal isolation region form a shallow trench isolation region.

14. The integrated structure of claim 10, wherein the second thermal isolation region comprises a gap provided in the second trench between the second photonic device and substrate.

15. The integrated structure of claim 3, wherein the low thermal conductivity material has a thermal conductivity that is less than approximately 0.006 W/cm° C.

16. The integrated structure of claim 3, wherein the low thermal conductivity material comprises silicon dioxide that has been doped with a dopant having a lower dielectric constant than the silicon dioxide.

17. The integrated structure of claim 16, wherein the dopant comprises fluorine.

18. The integrated structure of claim 16, wherein the dopant comprises carbon.

19. The integrated structure of claim 1, further comprising a second thermal isolation region formed within the first thermal isolation region.

20. The integrated structure of claim 1, wherein the first temperature-sensitive photonic device comprises a carrier wave modulator.

21. The integrated structure of claim 1, wherein the first temperature-sensitive photonic device comprises a laser.

22. The integrated structure of claim 19, wherein the second thermal isolation region has a different thermal conductivity than the first thermal isolation region.

23. The integrated structure of claim 22, wherein the second thermal isolation region has a lower thermal conductivity than the first thermal isolation region.

24. The integrated structure of claim 19, wherein the second thermal isolation region comprises a physical gap within the first thermal isolation region.

* * * * *